United States Patent
Sato

(10) Patent No.: US 7,195,847 B2
(45) Date of Patent: *Mar. 27, 2007

(54) IMAGE FORMING METHOD

(75) Inventor: Morimasa Sato, Shizuoka-ken (JP)

(73) Assignee: Fuji Photo Film Co., Ltd., Kanagawa JPX ( * ) Notice: Subject to any disclaimer, the term of this patent is extended or adjusted under 35 U.S.C. 154(b) by 330 days.

This patent is subject to a terminal disclaimer.

(21) Appl. No.: 10/372,231

(22) Filed: Feb. 25, 2003

(65) Prior Publication Data

US 2003/0162107 A1   Aug. 28, 2003

(30) Foreign Application Priority Data

Feb. 26, 2002   (JP) ............................. 2002-049546

(51) Int. Cl.
*G02B 5/20*   (2006.01)

(52) U.S. Cl. ........................... 430/7; 430/321; 430/325; 349/156

(58) Field of Classification Search ................ 430/321, 430/394, 322, 325, 273.1; 349/156
See application file for complete search history.

(56) References Cited

U.S. PATENT DOCUMENTS

| | | | |
|---|---|---|---|
| 4,835,086 A | 5/1989 | Jain | |
| 5,409,800 A * | 4/1995 | Sato et al. | 430/263 |
| 5,922,508 A | 7/1999 | Zertani et al. | |
| 6,162,589 A * | 12/2000 | Chen et al. | 430/320 |
| 2001/0026347 A1* | 10/2001 | Sawasaki et al. | 349/156 |
| 2003/0162107 A1 | 8/2003 | Sato | |

FOREIGN PATENT DOCUMENTS

| | | |
|---|---|---|
| JP | 04-301846 A | 10/1992 |
| JP | 07-135170 A | 5/1995 |

* cited by examiner

*Primary Examiner*—John A. McPherson
(74) *Attorney, Agent, or Firm*—Sughrue Mion, PLLC

(57) ABSTRACT

An image forming method of the invention is an image forming method comprising the steps of exposing, through a photo mask, a substrate, on which a first negative photosensitive resin layer and second negative photosensitive resin layer are formed, wherein the photo mask is a photo mask having at least two light transmittable patterns, and the photosensitivity ratio of the first negative photosensitive resin layer to the second negative photosensitive resin layer is more than 1. This method makes it possible to form an image easily, which is used suitably by a reflection and transmission LCD display wherein the film thickness of a colored layer is partially varied in each pixel, and to easily form a spacer and a projection for orientation control.

12 Claims, 2 Drawing Sheets

IMAGE FORMING METHOD

BACKGROUND OF THE INVENTION

1. Field of the Invention

The present invention relates to an image forming method; and a color filter, a spacer for liquid crystal display, and a projection for orientation control, which are formed by the image forming method. More specifically, the invention is an image forming method used suitably by liquid crystal display devices for reflection and transmission displays; and a color filter, a spacer for liquid crystal displays, and a projection for orientation control, which are formed by the image forming method.

2. Description of the Related Art

A color filter is used in a color face plate for cathode ray tube displays, a photoelectric conversion element plate for copying, a filter for single-tube system color television cameras, a flat panel display using liquid crystal, a color solid state image pickup device, or the like. A conventionally used color filter is made by regularly arranging the three primary colors (blue, green and red). A color filter having four or more hues as required is also known.

In recent years, as a liquid crystal display (LCD), a reflection type liquid crystal display device has been developed for a portable terminal, a typical example of which is a portable telephone. However, a problem of a reduction in display quality in rooms and dark places has been noticed. As a measure for improving the display quality, reflection and transmission dual purpose liquid crystal display devices have been suggested.

An example of the reflection and transmission dual purpose structure of the liquid crystal display device, includes an embodiment illustrated in FIG. 3. In this embodiment, reflective layers 12, which may be referred to as reflective plates, are arranged at predetermined intervals in a light transmittable substrate 10B, and transparent layers 16 are arranged at predetermined intervals in a light transmittable substrate 10A. Pixels 14 are formed to cover a part of each of the transparent layers 16. The light transmittable substrates 10A and 10B are set to be opposite to each other, and a liquid crystal layer 18 is formed therebetween.

In the case of a transmission display, the display is attained by transmitted light a from a backlight 20. In the case of a reflection display, the display is attained by reflected light c obtained by external light b being transmitted through the light transmittable substrate 10A and reflected by the reflective layers 12.

In the case of the reflection and transmission dual purpose display, the thickness of the portion of the color filter, through which portion light is transmitted, is the same for the transmission portion and the reflection portion. In the case that sufficient brightness is realized for reflection display, the color purity of the transmission portion is insufficient. In the case that the color purity of the transmission portion is conversely made sufficient, an inconvenience, wherein the reflection portion becomes dark, is caused. In order to solve such problems, making the thicknesses or hues of the transmission portion and the reflection portion of the color filter different from each other, so as to improve display quality, has been tried. However, this process is complicated and the costs rise.

To inclease the functions of an LCD panel, development of techniques for increasing the field angle, the contrast thereof and the like are progressing. Among those techniques, a VA technique, which uses a vertical orientation mode, and the formation of a spacer using a photo spacer are becoming mainstream. These mainstream techniques require a photolithography step for fabricating a structure of the spacer, and a photolithography step for fabricating a structure of a projection for orientation control, which is essential for the VA technique. Thus, costs of the LCD panel rise.

SUMMARY OF THE INVENTION

In order to solve the above-mentioned problems, an object of the present invention is to provide a method for forming an image easily, which is used suitably by a reflection and transmission LCD wherein the film thickness of a colored layer is partially varied in each pixel; and a method for easily forming a spacer and a projection for orientation control.

The invention for solving the above-mentioned problems is as follows.

That is, one aspect of the invention provides an image forming method comprising the steps of:

(A) forming a first negative photosensitive resin layer on a substrate;

(B) forming a second negative photosensitive resin layer on the first negative photosensitive resin layer;

(C) exposing the substrate through a photo mask; and (D) developing the first and second negative photosensitive resin layers after exposure, wherein, in the step C, the photo mask is a photo mask comprising at least two light transmittable patterns, and the photosensitivity ratio of the first negative photosensitive resin layer to the second negative photosensitive resin layer is more than 1.

The invention further provides the image forming method, wherein in the steps A and B, a transfer sheet comprising at least a negative photosensitive resin layer on a transparent support is used.

The invention further provides the image forming method, wherein in the steps A and B, a transfer sheet comprising, on a transparent support, at least a thermoplastic resin layer, an intermediate layer, and a negative photosensitive resin layer is used.

The invention further provides the image forming method, wherein in the step A, a transfer sheet comprising on a transparent support at least a negative photosensitive resin layer is used, and in the step B, a transfer sheet comprising, on a transparent support, at least a thermoplastic resin layer, an intermediate layer, and a photosensitive resin layer is used.

The invention further provides the image forming method, wherein the steps A through D are performed at least twice.

The invention further provides the image forming method, wherein a coloring agent is added to the first and second negative photosensitive resin layers.

The invention further provides a color filter for a liquid crystal display device, which is formed by the above-mentioned image forming method.

The invention further provides a spacer for a liquid crystal display device, which is formed by the above-mentioned image forming method.

The invention further provides a projection for orientation control, which is formed by the above-mentioned image forming method.

DETAILED DESCRIPTION OF THE PREFERRED EMBODIMENTS

Figure 1:
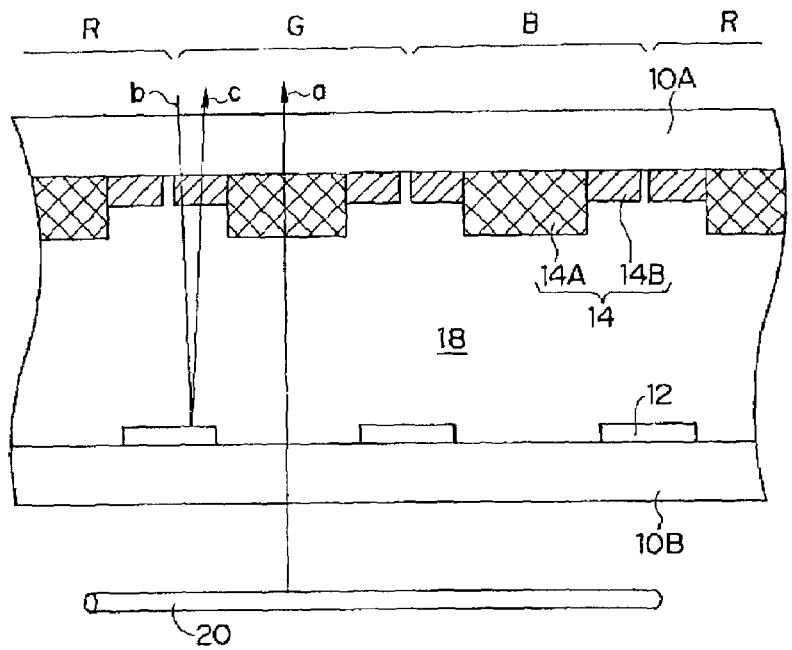
FIG. 1 is a view illustrating an example structure of a color filter of the present invention.

An image forming method of the present invention is an image forming method comprising the steps of exposing a substrate over which a first negative photosensitive resin layer and second negative photosensitive resin layer are formed to light through a photo mask, wherein the photo mask is a photo mask having at least two light transmittable patterns, and the photosensitivity ratio of the first negative photosensitive resin layer to the second negative photosensitive resin layer is more than 1.

According to the invention, the substrate is pattern-exposed to light through the mask having at least two light transmittances inside each of pixels. By this single-time exposure, the photosensitive resin having different film thicknesses can be laminated on areas inside each of the pixels. As a result, a liquid crystal display device for reflection and transmission displays can be formed at a time. A spacer and a projection for orientation control can also be formed at a time.

The invention will be described in detail hereinafter.

Light Transmittable Substrate:

As the substrate used in the invention, preferred is a light transmittable substrate having transparency, optical isotropy and sufficient heat resistance. Examples thereof include polyethylene terephthalate, polybutylene terephthalate, polyethylene naphthalate, polystyrene, polycarbonate, polyether sulfone, cellulose acetate, polyarylate, soda glass, borosilicate glass, and quartz. The surface of the light transmittable substrate may be subjected to undercoating treatment if necessary. Furthermore, the surface may be subjected to glow discharge, corona discharge, ultraviolet ray (UV) radiation or some other treatment.

The light transmittable substrate may be used in the form of a plate, a sheet, a film or the like. The thickness of the substrate can be appropriately set dependently on use and the material thereof. In general, the thickness is preferably from 0.01 to 10 mm. When the substrate is, for example, a glass substrate, the thickness thereof is preferably from 0.3 to 3 mm.

In the case that the LCD panel for reflection and transmission displays of the invention performs reflection display, a reflective layer for reflecting incident external light is formed on the light transmittable substrate. As the reflective layer, Al, Mo or the like is preferably used. The thickness of the reflective layer is preferably from about 100 to 10000 Å. The method of forming the reflective layer is not particularly limited. The layer can be formed by, for example, vapor deposition sputtering.

Negative Photosensitive Resin Layer:

In the invention, the negative photosensitive resin layer preferably becomes soft or adhesive at a temperature of 150° C. or less, and is preferably thermoplastic. Most of layers using a known photopolymerizable composition have this nature. A part of the known layers can be further reformed by the addition of a thermoplastic binder or the addition of a compatible plasticizer.

As the material of the negative photosensitive resin layer of the invention, all known negative photosensitive resin layers, for example, negative photosensitive resin layers described in, for example, JP-A (Japanese Patent Application Laid-Open) No. 3-282404 can be used. Specific examples thereof include a photosensitive resin layer made of a negative diazo resin and a binder, a photopolymerizable resin comprising a photopolymerizable monomer, a photopolymerization initiator and a binder, a photosensitive resin composition made of an azide compound and a binder, and a cinnamic acid type photosensitive resin composition. Particularly preferred is the photopolymerizable resin. As photosensitive resins, known are resins which can be developed with an aqueous alkali solution and resins which can be developed with an organic solvent. The resins which can be developed with an aqueous alkali solution are preferred from the viewpoint of anti-pollution and the maintenance of labor safety.

In the invention, a photosensitivity difference is caused to be generated between the photosensitive resin layer of the first layer and the photosensitive resin layer of the second layer, whereby a pattern made of only the first layer and a pattern made of the first and second layers can be simultaneously formed by exposure through a gradation mask, which will be described in detail later. In the case that no photosensitivity difference is generated, in exposure through the gradation mask, the exposure value is adjusted in the transmission portion and the halftone portion. However, the material has no sensitivity difference; therefore, only a pattern of the laminated first and second layers is formed. That is, no pattern of only the first layer can be formed in principle. Therefore, in order to form a pattern of only the first layer and a pattern of the first and second layers simultaneously, it is necessary that the photosensitivity of the photosensitive resin layer of the first layer and that of the photosensitive resin layer of the second layer are different from each other and the sensitivity ratio of the first layer to the second layer is more than 1. Preferably, the sensitivity ratio of the first layer to the second layer is 2 or more.

In the invention, the photosensitivity is defined as the lowest exposure value making it possible to yield an image after the step of developing a photosensitive resin layer.

The photosensitivity of a photosensitive resin varies dependently on the pigment content, the photopolymerization initiator content or the amount of the monomer. In order to generate a preferred photosensitivity difference between the first layer and the second layer in the invention, it is preferred to set the ratio of the first negative photosensitive resin and the second negative photosensitive resin to 2:1 to 100:1.

A known dye or pigment may be added to the first or second photosensitive resin layer. It is preferred that all of the pigment particles are uniformly dispersed in the photosensitive resin layer and the particle size thereof is 5 μm or less. It is particularly preferred that the particle size is 1 μm or less. When a color filter is produced, it is preferred that the particle size of the pigment is 0.5 μm or less.

Preferred examples of the dye or pigment include Victora Pure Blue BO (C. I. 42595), auramine (C. I. 41000), Fat Black HB (C. I. 26150), Monolight Yellow GT (C. I. Pigment Yellow 12), Permanent Yellow GR (C. I. Pigment Yellow 17), Permanent Yellow HR (C. I. Pigment Yellow 83), Permanent Carmine FBB (C. I. Pigment Red 146), Hoster Baum Red ESB (C. I. Pigment Violet 19), Permanent Ruby FBH (C. I. Pigment Red 11), Fastel Pink B Supra (C. I. Pigment Red 81), Monastral Fast Blue (C. I. Pigment Blue 15), Monolight Fast Black B (C. I. Pigment Black 1), and carbon.

Examples of a pigment suitable for forming a color filter include C. I. Pigment Red 97, C. I. Pigment Red 122, C. I.

Pigment Red 149, C. I. Pigment Red 168, C. I. Pigment Red 177, C. I. Pigment Red 180, C. I. Pigment Red 192, C. I. Pigment Red 215, C. I. Pigment Green 7, C. I. Pigment Green 36, C. I. Pigment Blue 15:1, C. I. Pigment Blue 15:4, C. I. Pigment Blue 15:6, C. I. Pigment Blue 22, C. I. Pigment Blue 60, and C. I. Pigment Blue 64.

Thermoplastic Resin Layer:

A thermoplastic resin layer is formed, as a first layer, on a pre-support in order to avoid the incorporation of bubbles at the time of transferring. The thermoplastic resin layer mainly comprises a thermoplastic resin and optionally comprises some other component. Since it is preferred in the invention that only the photosensitive resin layer is formed, as the first layer, on the substrate, it is unnecessary but allowable to form the thermoplastic resin layer on the pre-support. On the other hand, in the photosensitive resin layer of the second layer, it is preferred to form a thermoplastic resin layer in order to prevent the incorporation of bubbles at the time of transferring.

The thermoplastic resin is preferably a resin which can be dissolved in aqueous alkali solution in order to make alkali development after transferring possible or in order to remove contamination on a conductive film, which is an object in which an image is to be transferred, the contamination resulting from the thermoplastic resin forced out to the surrounding thereof dependently on transferring conditions at the time of the transferring. In order to cause the layer to function, when the thermoplastic resin layer is transferred onto the conductive film, which is an object to be transferred, on the substrate as a cushion material for preventing transferring-inferior resulting from irregularities present in the conductive film, the thermoplastic resin layer preferably has such a sufficient plasticity that the thermoplastic resin layer can deform in accordance with the irregularities when the thermoplastic resin layer is heated and adhered to the conductive film.

From the viewpoint of the above, the thermoplastic resin is preferably a resin which has alkali-solubility and a substantial softening point of 80° C. or less.

A transferring material is formed by laminating the thermoplastic resin layer, an intermediate layer, which will described in detail later, and the photosensitive resin layer successively on the pre-support. It is necessary to make the adhesive strength between the thermoplastic resin layer and the pre-support smaller than that between any other layers. In this way, the pre-support can easily be removed without breaking the surface of the thermoplastic resin layer surface after transferring. That is, the above-mentioned requirement is important since the photosensitive resin layer after the pre-support is removed can be uniformly exposed to light.

The thermoplastic resin layer can be formed by dissolving the thermoplastic resin and optional other components in an organic solvent to prepare a coating solution (for the thermoplastic resin layer), and then coating the pre-support with the coating solution by a known coating method such as spin coating.

The layer thickness of the thermoplastic resin layer is preferably from 6 to 100 μm, more preferably from 6 to 50 μm. When the layer thickness ranges from 6 to 100 μm, irregularities having a size of 1 μm or more in the conductive layer surface can be completely cancelled and the developability and production suitability are not lowered.

Intermediate Layer:

The intermediate layer has a function of preventing the photosensitive resin layer and the thermoplastic resin layer from being mixed by using an organic solvent in the two layers. For the first layer in the invention, it is preferred to form only the photosensitive resin layer on the substrate; therefore, it is unnecessary but allowable to from the intermediate layer on the pre-support. On the other hand, for the photosensitive resin layer of the second layer, it is preferred to form the intermediate layer. It is sufficient that the intermediate layer can be dispersed or dissolved in water or aqueous alkali solution. Preferably, the intermediate layer has a low oxygen permeability. The intermediate layer is made mainly of a resin component which can be dispersed or dissolved in water or aqueous alkali solution. If necessary, this layer may comprise some other component such as a surfactant.

It is particularly preferred that the intermediate layer is made of a combination of polyvinyl alcohol and polyvinyl pyrrolidone. The polyvinyl alcohol preferably has a saponification degree of 80% or more. The content of the polyvinyl pyrrolidone is preferably from 1 to 75%, more preferably from 1 to 60% and most preferably from 10 to 50% of the solid volume of the intermediate layer.

When the oxygen blocking capability of the intermediate layer is lowered, the polymerization sensitivity of the photosensitive resin layer is lowered. As a result, it is necessary to raise the exposure value at the time of exposure to light or make the exposure time long. Additionally, the resolution is also lowered. Thus, the intermediate layer preferably has a small oxygen permeability.

The layer thickness of the intermediate layer is preferably from about 0.1 to 5 μm, more preferably from 0.5 to 2 μm. When the layer thickness ranges from about 0.1 to 5 μm, it does not happen that the polymerization sensitivity of the photosensitive resin layer is lowered by an excessively high oxygen permeability and a long time is required for the development and removal of the intermediate layer.

Pre-support:

The pre-support used in the transfer sheet having the first negative photosensitive resin layer is preferably a pre-support which easily makes peeling between the intermediate layer and the photosensitive resin layer possible. For this purpose, the pre-support is preferably coated with an undercoat made of gelatin, SBR resin or the like. Gelatin is most preferred. A pre-support subjected to corona surface treatment may also be used.

On the other hand, the pre-support used in the transfer sheet having the second negative photosensitive resin layer is preferably a pre-support which has a peeling property such that the transferring of the thermoplastic resin layer is not hindered. In order to keep good peeling property between the pre-support and the thermoplastic resin layer, it is preferred that the pre-support is not subjected to surface treatment such as glow discharge or the undercoat layer made of gelatin or the like is not formed.

The pre-support used in any one of the two transfer sheets is preferably a chemically and thermally stable and flexible pre-support. Specific preferred examples thereof include thin layer sheets made of Teflon (registered trade mark), polyethylene terephthalate, polycarbonate, polyethylene, polypropylene or the like, or laminations thereof. The thickness of the pre-support is preferably from 5 to 300 μm, more preferably from 20 to 150 μm.

Cover Film:

In order to protect the photosensitive resin layer from being contaminated or damaged at the time of storing the present transfer sheet, it is preferred to form a cover film on the photosensitive resin layer. The cover film can be selected from films which can easily be peeled from the photosensitive resin layer, and may be made of a material equivalent or similar to the pre-support. Specific preferred examples thereof include silicone paper; and polyolefin or polytetrafluoroethylene sheets. Polyethylene and polypropylene films are more preferred.

The thickness of the cover film is preferably from about 5 to 100 µm, more preferably from 10 to 30 µm.

Transferring of Transfer Sheet Onto Substrate:

In the transferring of the photosensitive transfer sheet onto any one of the above-mentioned substrate in the invention, the cover film of the first photosensitive transfer sheet is first peeled, and a laminator is used to put the sheet on the substrate by heating under pressure. Next, peeling is performed between the intermediate layer and the photosensitive colored layer to transfer only the colored layer on the substrate. Furthermore, the cover film of the second photosensitive transfer sheet is peeled and the sheet is stuck on the lamination obtained as described above in such a manner that the colored layer of the second layer contacts the colored layer surface of the first layer. Next, peeling is carried out between the pre-support and the thermoplastic resin layer so as to transfer the photosensitive resin layer of the first layer, the photosensitive resin layer of the second layer, the intermediate layer and the thermoplastic resin layer on the substrate.

Photo Mask:

In the case that the photosensitive resin layer transferred on the substrate is patterned, the layer is irradiated with light through a photo mask having a given pattern. In this way, pattern-exposure is performed. Thereafter, the layer is developed to yield a pattern-form colored layer. A photo mask generally has light completely-transmitting portions and light shading portions. The photo mask used in the invention further has at least one halftone portion, and is characterized by being such a gradation mask. These portions are appropriately decided in accordance with the photosensitivity of the layers which should be left after the development thereof, thereby forming the photo mask used in the invention. Specifically, the halftone portion is selected for the moiety where only the first layer should be left, and the completely-transmitting portion is selected for the moiety where all the layers should be left. The light shading portion is selected for the moiety where no layers should be left.

Pattern Exposure and Development:

The above-mentioned photo mask is used to radiate light having wavelengths of 300 to 500 nm, thereby performing the pattern-exposure. As the light source, there can be used, for example, a high-pressure mercury lamp, a super high mercury lamp, a metal halide lamp, a Hg—Xe lamp or the like.

After the exposure, developing treatment is performed to remove the thermoplastic resin layer, the intermediate layer and unnecessary portions (non-cured portions) of the photosensitive resin layers.

A structure example of the color filter formed by the image forming method of the invention is illustrated in FIG. 1. About a transfer sheet in which a first photosensitive resin layer having a high photosensitivity is stuck on a second photosensitive resin layer having a relatively low photosensitivity, the halftone portion of the photo mask is used for a reflection type liquid crystal display moiety, and the completely-transmitting portion of the photo mask is used for a transmission type liquid crystal display moiety. In this manner, exposure and development are performed. In the portion where the halftone portion of the photo mask is used, only the first photosensitive resin layer remains as pixels 14B after the development. On the other hand, in the portion where the completely-transmitting portion of the photo mask is used, the first photosensitive resin layer and the second photosensitive resin layer remain as pixels 14A after the development. As a result, the film thickness of the pixels 14A, made of the remaining first and second photosensitive resin layers, is larger than that of the pixels 14B, made of only the remaining first photosensitive resin layer, by the film thickness of the second photosensitive resin layer. The pixels 14 A, made of the first and second photosensitive resin layers, are formed to have a film thickness suitable for a transmission type display device, and the pixels 14B, made of only the first photosensitive resin layer, are formed to have a film thickness suitable for a reflection type display device.

A developing solution is classified into an inorganic developing solution and an organic developing solution. In the case that a color filter is formed on a glass substrate, either of the developing solutions can be used. However, in the case that a color filter is formed on a COA, that is, a TFT active matrix substrate, Na or K ions in the inorganic alkali developing solution cause contamination. It is therefore preferred to use the organic alkali developing solution.

The aqueous alkali solution is preferably a thin solution of an alkaline material in water. A solution in which a small amount of an organic solvent miscible with water is added to the thin solution can be preferably used. The concentration of the alkaline material in the aqueous alkali solution is preferably from 0.01 to 30% by mass, and the pH thereof is preferably from 8 to 14.

The organic alkali developing solution is a developing solution containing an organic compound having a pKa of 7 to 13 at a concentration of 0.05 to 5 mole/L. A small amount of an organic solvent miscible with water may be added thereto. The pH of the developing solution is preferably from 8 to 13. Examples of the organic solvent miscible with water include methanol, ethanol, 2-propanol, 1-propanol, butanol, diacetone alcohol, ethylene glycol monomethyl ether, ethylene glycol monoethyl ether, ethylene glycol mono n-butyl ether, benzyl alcohol, acetone, methyl ethyl ketone, cyclohexanone, ε-caprolactone, γ-butyrolactone, dimethylformamide, dimethylacetoamide, hexamethylphosphoamide, ethyl lactate, methyl lactate, ε-caprolactam, and N-methylpyrrolidone. The concentration of the organic solvent is preferably from 0.1 to 30% by mass.

Known various surfactants may be added to the aqueous alkali solution. The concentration of the surfactant is preferably from 0.01 to 10% by mass.

The development can be performed by a known method. Using a solvent or an aqueous developing solution, in particular, an aqueous alkali solution, (a) the exposed substrate itself is immersed into a developing bath, or (b) the developing solution is sprayed onto the exposed substrate with a spray. In order to make the solubility of the exposed photosensitive resin layer high, the development may be performed while the exposed substrate is rubbed with a rotating brush or a wet sponge or ultrasonic waves are applied thereto if necessary.

In order to remove the soluble portion of the exposed photosensitive resin layer, this portion may be rubbed with a rotating brush or a wet sponge inside the developing solution. The solution temperature of the developing solution is preferably from 20 to 40° C. After the developing treatment, it is preferred to perform a water-washing step using distilled water, ion exchange water, ultra pure water or the like. After the developing, it is preferred to bake the developed substrate at 200 to 260° C.

Formation of Spacer and Projection Structure:

Typically, a liquid crystal display device is formed by sandwiching a liquid crystal layer between two substrates, i.e., a filter-side substrate having a color filter and a conductive layer (for example, a transparent pixel electrode) on the color filter, and an opposite substrate, which is arranged to be opposite to the filter-side substrate, having a conductive layer (for example, a transparent common electrode). A driving element such as a thin film transistor (TFT) may be formed on any one of the filter-side substrate and the opposite substrate.

In the invention, a spacer for a liquid crystal display device and a projection for liquid crystal orientation can be simultaneously formed on a color filter through a single photolithography step using a transparent photosensitive resin material. The spacer is a member for keeping the thickness of the liquid crystal layer (cell gap) constant, and it is necessary to form the spacer uniformly throughout the display area. By forming the projection for liquid crystal orientation, the direction of the orientation of the liquid crystal molecules is regulated and a wide field angle, which does not depend on a position (field angle) for observing the liquid crystal surface, can be kept. In the invention, the spacer for a liquid crystal display device and the projection for liquid crystal orientation can be simultaneously formed by the following method.

ITO is sputtered onto a color filter formed in advance. The cover film of the first transparent photosensitive transferring material of the first layer is peeled. A laminator is used to stick the transferring material on the color filter by heating under pressure in such a manner that the photosensitive resin layer surface contacts the ITO surface. Only the transparent layer of the first layer is transferred onto the glass substrate. Furthermore, the cover film of the transparent photosensitive transferring material of the second layer is peeled, and then the transferring material is stuck on the transparent layer surface of the first layer in such a manner that the transparent layer surface of the second layer contacts the transparent layer surface of the first layer. Thereafter, peeling is carried out between the pre-support and the thermoplastic resin layer, so as to transfer, onto the glass substrate, the transparent photosensitive resin layer of the first layer, the transparent photosensitive resin layer of the second layer, the intermediate layer and the thermoplastic resin layer. In this case, the photosensitivity of the transparent photosensitive resin layer of the first layer is different from that of the transparent photosensitive resin layer of the second layer, and the photosensitivity ratio of the transparent photosensitive resin layer of the first layer to the transparent photosensitive resin layer of the second layer is more than 1. More preferably the value is 2 or more.

Next, the resultant is exposed through the above-mentioned gradation photo mask and developed to remove the thermoplastic resin layer and intermediate layer and further remove unnecessary portions of the photosensitive resin layers, thereby forming a pattern of only the first layer and a transparent pixel pattern of the laminated first and second layers. Next, the resultant is baked at 200 to 260° C. for 20 to 150 minutes so that a spacer pattern and a projection for orientation control can be simultaneously formed on the ITO.

Figure 2:
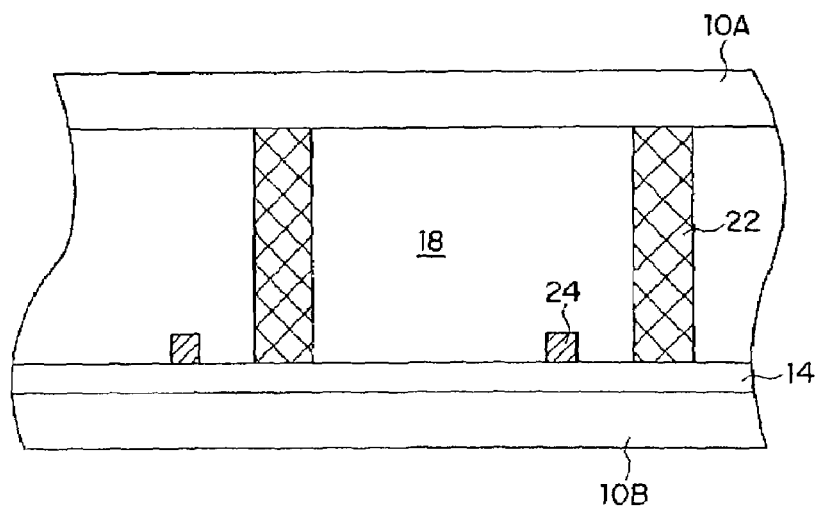
FIG. 2 is a view illustrating example structures of a spacer and a projection for orientation control of the invention.
Figure 3:
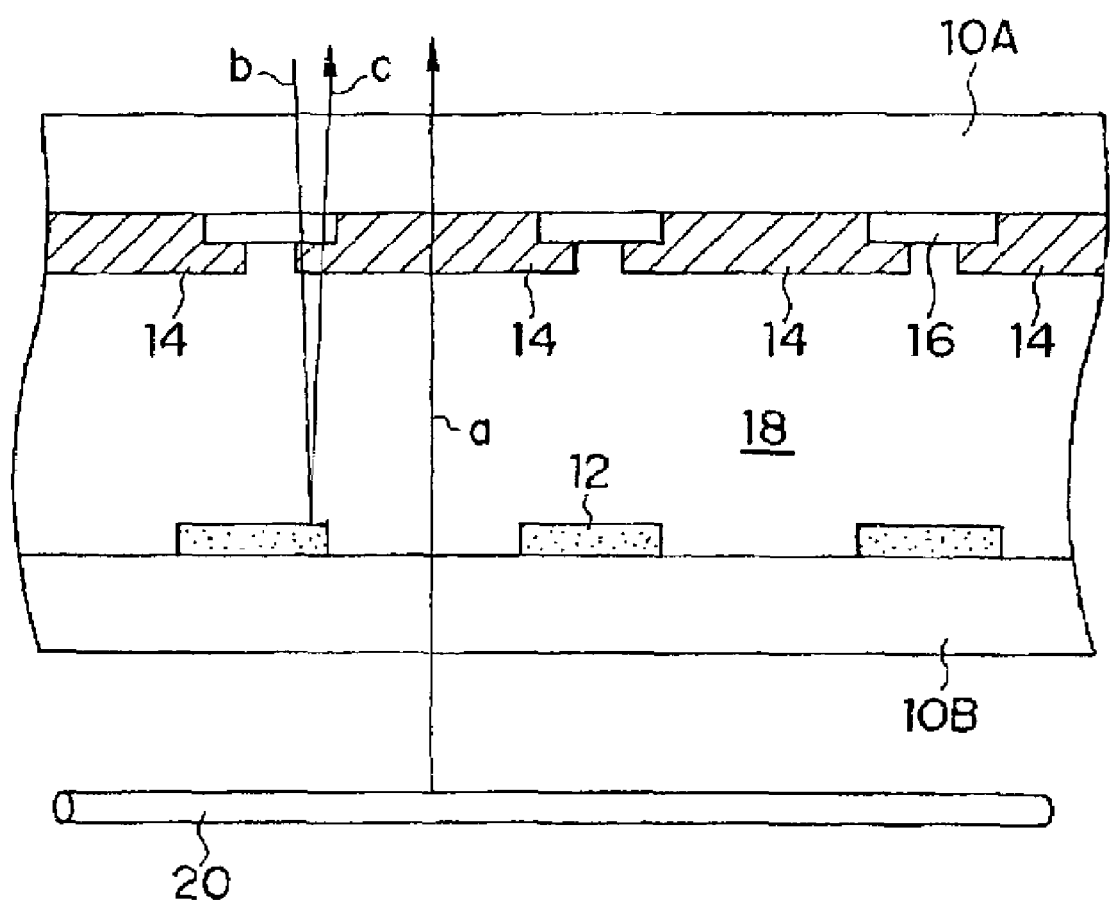
FIG. 3 is a view illustrating an example of an LCD panel for reflection and transmission displays.

FIG. 2 illustrates a structure example of a color filter formed by the image forming method of the invention. About a transfer sheet in which first photosensitive resin layer having a high photosensitivity is stuck on a second photosensitive resin layer having a relatively low photosensitivity, the halftone portion of the photo mask is used for a projection moiety for orientation control, and the completely-transmitting portion of the photo mask is used for a spacer moiety In this manner, exposure and development are performed. In the portion where the halftone portion of the photo mask is used, only the first photosensitive resin layer remains as pixels 24 after the development. On the other hand, in the portion where the completely-transmitting portion of the photo mask is used, the first photosensitive resin layer and the second photosensitive resin layer remain as pixels 22 after the development. As a result, the pixels 22 made of the remaining first and second photosensitive resin layers have a large thickness, and the thickness of the transparent photosensitive resin layers is set to an arbitrary thickness, whereby a spacer having a preferred thickness can be obtained. The pixels 24 made of only the remaining first photosensitive resin layer are formed to have a film thickness suitable for a projection moiety for orientation control.

EXAMPLES

The invention will be more specifically described by way of Examples hereinafter. However, the invention is not limited to these examples.

Example 1

Formation of a Color Filter

Prepared was a polyethylene terephthalate film pre-support (75 μm in thickness) undercoated with a gelatin layer (0.2 μm in thickness). A coating solution having the following formulation H1 was applied onto the gelatin layer surface and dried to form a thermoplastic resin layer (20 μm in dry film thickness).

Thermoplastic resin layer formulation H1:

| | |
|---|---|
| Methyl methacrylate/2-ethylhexyl acrylate/benzyl methacrylate/methacrylic acid copolymer (copolymer composition ratio (mole ratio) = 55/4.5/11.7/28.8) (weight-average molecular weight = 90000) | 15 parts by mass |
| Polypropylene glycol diacrylate (average molecular weight = 822) | 6.5 parts by mass |
| Tetraethylene glycol dimethacrylate | 1.5 parts by mass |
| p-Toluenesulfonamide | 0.5 part by mass |
| Benzophenone | 1.0 part by mass |
| Methyl ethyl ketone | 30 parts by mass. |

Next, a coating solution having the following formulation B1 was applied onto the above-mentioned thermoplastic resin layer, and dried to form an intermediate layer (1.6 μm in dry film thickness).

Intermediate layer formulation B1:

| | |
|---|---|
| Polyvinyl alcohol (trade name: PVA 205, made by Kuraray Co., Ltd, saponification degree: 80%) | 130 parts by mass |
| Polyvinyl pyrrolidone (trade name: PVP, K-90, made by GAF Corp.) | 60 parts by mass |
| Fluorine-type surfactant (trade name: Surflon S-131, made by Asahi Glass Company) | 10 parts by mass |
| Distilled water | 3350 parts by mass |

Three photosensitive solutions of red (for an R1 layer) green (for a G1 layer) and blue (for a B1 layer) each having a formulation described in the following Table 1 were applied onto four pre-supports having the above-mentioned thermoplastic resin layer and intermediate layer, and dried to form three colored photosensitive resin layers (1.2 μm in thickness).

TABLE 1

|  | R1 | R2 | R3 |
|---|---|---|---|
| Benzyl methacrylate/methacrylic acid copolymer (mole ratio = 73/27, molecular weight = 30000) | 7.8 | 10.2 | 9.8 |
| Dipentaerythritol hexaacrylate | 5.2 | 4.6 | 6.1 |
| Fluorine type surfactant (Megafac F176, made by Dainippon Ink & Chemicals. Inc.) | 0.06 | 0.14 | 0.12 |
| 7-[2-[4-(3-Hydroxymethylpiperidino)-6-diethylamino]triazylamino]-3-phenylcoumalin | 1.49 | 1.26 | 0.25 |
| 2-Trichloromethyl-5-(p-styrylstyryl)-1,3,4-oxadiazole | 0.32 | 0.22 | 0.23 |
| Phenothiazine | 0.012 | 0.006 | 0.025 |
| C.I. PR254 dispersed solution (RT-107, made by Fuji Film Olin Co., Ltd.) | 8.6 | 0 | 0 |
| C.I. PG36 dispersed solution (GT-2, made by Fuji Film Olin Co., Ltd.) | 0 | 5.6 | 0 |
| C.I. PY138 dispersed solution (YT-123, made by Fuji Film Olin Co., Ltd.) | 0 | 3.9 | 0 |
| C.I. PB 15:6 dispersed solution (MHI blue 7075 M, made by Mikuni Shikiso Co., Ltd.) | 0 | 0 | 13.2 |
| Propylene glycol monomethyl ether acetate | 27 | 26 | 14 |
| Methyl ethyl ketone | 35 | 34 | 44 |

Furthermore, a cover film made of polypropylene (12 μm in thickness) was stuck on each of the photosensitive resin layers under pressure to form red (R1), blue (B1) and green (G1) photosensitive transferring materials.

Next, a coating solution having the following formulation H1 was applied onto the PET surface of a polyethylene terephthalate film pre-support (75 μm in thickness), and dried to form a thermoplastic resin layer (20 μm in dry film thickness) thereon.

Thermoplastic resin layer formulation H1:

| | |
|---|---|
| Methyl methacrylate/2-ethylhexyl acrylate/benzyl methacrylate/methacrylic acid copolymer (copolymer composition ratio (mole ratio) = 55/4.5/11.7/28.8), weight-average molecular weight = 90000 | 15 parts by mass |
| Polypropylene glycol diacrylate (average molecular weight = 822) | 6.5 parts by mass |
| Tetraethylene glycol dimethacrylate | 1.5 parts by mass |
| p-Toluenesulfonamide | 0.5 part by mass |
| Benzophenon | 1.0 part by mass |
| Methyl ethyl ketone | 30 parts mass |

Next, a coating solution having the following formulation B1 was applied onto the above-mentioned thermoplastic resin layer, and dried to form an intermediate layer (1.6 μm in dry film thickness).

Intermediate layer formulation B1:

| | |
|---|---|
| Polyvinyl alcohol (trade name: PVA 205, made by Kuraray Co., Ltd, saponification degree: 80%) | 130 parts by mass |
| Polyvinyl pyrrolidone (trade name: PVP, K-90, made by GAF Corp.) | 60 parts by mass |
| Fluorine-type surfactant (trade name: Surflon S-131, made by Asahi Glass Company) | 10 parts by mass |
| Distilled water | 3350 parts by mass |

Three photosensitive solutions of red (for an R2 layer), green (for a G2 layer) and blue (for a B2 layer) each having a formulation described in the following Table 2 were applied onto the four pre-supports having the above-mentioned thermoplastic resin layer and intermediate layer, and dried to form three colored photosensitive resin layers (1.2 μm in thickness).

TABLE 2

|  | R2 | G2 | B2 |
|---|---|---|---|
| Benzyl methacrylate/methacrylic acid copolymer (mole ratio = 73/27, molecular weight = 30000) | 7.8 | 10.2 | 9.8 |
| Dipentaerythritol hexaacrylate | 5.2 | 4.6 | 6.1 |
| Fluorine type surfactant (Megafac F176, made by Dainippon Ink & Chemicals. Inc.) | 0.06 | 0.14 | 0.12 |
| 7-[2-[4-(3-Hydroxymethylpiperidino)-6-diethylamino]triazylamino]-3-phenylcoumalin | 1.49 | 1.26 | 0.25 |
| 2-Trichloromethyl-5-(p-styrylstyryl)-1,3,4-oxadiazole | 0.32 | 0.22 | 0.23 |
| Phenothiazine | 0.12 | 0.006 | 0.25 |
| C.I. PR254 dispersed solution (RT-107, made by Fuji Film Olin Co., Ltd.) | 19.2 | 0 | 0 |
| C.I. PG36 dispersed solution (GT-2, made by Fuji Film Olin Co., Ltd.) | 0 | 11.3 | 0 |
| C.I. PY138 dispersed solution (YT-123, made by Fuji Film Olin Co., Ltd.) | 0 | 7.8 | 0 |
| C.I. PB 15:6 dispersed solution (MHI blue 7075 M, made by Mikuni Shikiso Co., Ltd.) | 0 | 0 | 26.4 |
| Propylene glycol monomethyl ether acetate | 27 | 26 | 14 |
| Methyl ethyl ketone | 35 | 34 | 44 |

Furthermore, a cover film made of polypropylene (12 μm in thickness) was stuck on each of the photosensitive resin layers under pressure to form red (R2), blue (B2) and green (G2) photosensitive transferring materials.

These photosensitive transferring materials were used to produce a color filter in the following way. The cover film of the R1 red photosensitive transferring material was peeled, and then a laminator (trade name: VP-11, made by Taisei Laminator Co., Ltd.) was used to stick the photosensitive resin layer surface on a transparent glass substrate (1.1 mm in thickness) by heating (130° C.) under pressure (0.8 kg/cm$^2$). Subsequently, peeling was performed between the intermediate layer and the photosensitive colored layer to transfer only the R1 red colored layer onto the glass substrate. Furthermore, the cover film of the R2 red photosensitive transferring material was peeled, and then the same sticking as described above was performed in such a manner that the R2 red colored layer contacted the R1 red colored layer surface. Peeling was then performed between the pre-support and the thermoplastic resin layer to transfer the R1 red photosensitive resin layer, the R2 red photosensitive resin layer, the intermediate layer and the thermoplastic resin layer onto the glass substrate.

Next, the resultant was exposed to light through a given chromium photo mask (2-gradation mask: first area optical density/second area optical density=1/0.1), and then the thermoplastic resin layer and the intermediate layer were removed with a developing solution (trade name: PD2, made by Fuji Photo Film Co., Ltd.). At this time, the photosensitive resin layers were not substantially developed. Next, the photosensitive resin layers were developed with a developing solution (trade name: CD1, made by Fuji Photo Film Co., Ltd.) to remove unnecessary portions. Finishing treatment (brush treatment) was then conducted with a developing solution (trade name: SD1, made by Fuji Photo Film Co., Ltd.) to form a pattern made of only the R1 layer and a red pixel pattern made of the laminated R1 and R2 layers. Next, the G1 and G2 green transferring materials were stuck on the glass substrate on which the red pixel patterns were formed in the same way as described above, and then peeling, exposure to light and development were performed to form a green pixel pattern made of only the G1 layer and a green pixel pattern made of the laminated G1 and G2 layers. The same process was repeated for the B1 and B2 blue photosensitive transferring materials, so as to form a color filter on the transparent glass substrate.

Example 2

Formation of a Color Filter

A color filter of Example 2 was formed in the same way as in Example 1 except that instead of the formation of the three colored photosensitive resin layers of red (R1), green (G1) and blue (B1) in Example 1, three photosensitive solutions of red (R1), blue (B1) and green (G1) each having a formulation shown in Table 1 were directly applied onto a polyethylene terephthalate film pre-support (75 μm in thickness), and dried to form three colored photosensitive resin layers (1.2 μm in film thickness).

Example 3

Formation of a Spacer and a Projection for Orientation Control

Prepared was a polyethylene terephthalate film pre-support (75 μm in thickness) undercoated with a gelatin layer (0.2 μm in thickness). A coating solution having the following formulation H1 was applied onto the gelatin layer surface and dried to form a thermoplastic resin layer (20 μm in dry film thickness).

Thermoplastic resin layer formulation H1:

| | |
|---|---|
| Methyl methacrylate/2-ethylhexyl acrylate/benzyl methacrylate/methacrylic acid copolymer (copolymer composition ratio (mole ratio) = 55/4.5/11.7/28.8) (weight-average molecular weight = 90000) | 15 parts by mass |
| Polypropylene glycol diacrylate (average molecular weight = 822) | 6.5 parts by mass |
| Tetraethylene glycol dimethacrylate | 1.5 parts by mass |
| p-Toluenesulfonamide | 0.5 part by mass |
| Benzophenone | 1.0 part by mass |
| Methyl ethyl ketone | 30 parts by mass |

Next, a coating solution having the following formulation B1 was applied onto the above-mentioned thermoplastic resin layer, and dried to form an intermediate layer (1.6 μm in dry film thickness).

Intermediate layer formulation B1:

| | |
|---|---|
| Polyvinyl alcohol (trade name: PVA 205, made by Kuraray Co., Ltd, saponification degree: 80%) | 130 parts by mass |
| Polyvinyl pyrrolidone (trade name: PVP, K-90, made by GAF Corp.) | 60 parts by mass |
| Fluorine-type surfactant (trade name: Surflon S-131, made by Asahi Glass Company) | 10 parts by mass |
| Distilled water | 3350 parts by mass |

A transparent photosensitive solution (for an A1 layer) having a formulation described in the following Table 3 was applied onto the pre-support having the above-mentioned thermoplastic resin layer and intermediate layer, and dried to form an A1 transparent photosensitive resin layer (1.2 μm in thickness).

TABLE 3

| | A1 |
|---|---|
| Benzyl methacrylate/methacrylic acid copolymer mole ratio = 73/27, molecular weight = 30000) | 7.8 |
| Dipentaerythritol hexaacrylate | 5.2 |
| Fluorine type surfactant (Megafac F176, made by Dainippon Ink & Chemicals. Inc.) | 0.06 |
| 2-Trichloromethyl-5-(p-styrylstyryl)-1,3,4-oxadiazole | 0.32 |
| Phenothiazine | 0.012 |
| Propylene glycol monomethyl ether acetate | 27 |
| Methyl ethyl ketone | 35 |

Furthermore, a cover film made of polypropylene (12 μm in thickness) was stuck on the above-mentioned photosensitive resin layer under pressure to form a transparent (A1) photosensitive transferring material.

Next, a coating solution having the following formulation H1 was applied onto the PET surface of a polyethylene terephthalate film pre-support (75 μm in thickness), and dried to form a thermoplastic resin layer (20 μm in dry film thickness) thereon.

Thermoplastic resin layer formulation H1:

| | |
|---|---|
| Methyl methacrylate/2-ethylhexyl acrylate/benzyl methacrylate/methacrylic acid copolymer (copolymer composition ratio (mole ratio) = 55/4.5/11.7/28.8) (weight-average molecular weight = 90000) | 15 parts by mass |
| Polypropylene glycol diacrylate (average molecular weight = 822) | 6.5 parts by mass |
| Tetraethylene glycol dimethacrylate | 1.5 parts by mass |
| p-Toluenesulfonamide | 0.5 part by mass |
| Benzophenone | 1.0 part by mass |
| Methyl ethyl ketone | 30 parts by mass |

Next, a coating solution having the following formulation B1 was applied onto the above-mentioned thermoplastic resin layer, and dried to form an intermediate layer (1.6 μm in dry film thickness).

Intermediate layer formulation B1:

| | |
|---|---|
| Polyvinyl alcohol (trade name: PVA 205, made by Kuraray Co., Ltd, saponification degree: 80%) | 130 parts by mass |
| Polyvinyl pyrrolidone (trade name: PVP, K-90, made by GAF Corp.) | 60 parts by mass |
| Fluorine-type surfactant (trade name: Surflon S-131, made by Asahi Glass Company) | 10 parts by mass |
| Distilled water | 3350 parts by mass |

A photosensitive solution of transparent color (for a P1 layer) having a formulation described in the following Table 4 was applied onto the pre-support having the above-mentioned thermoplastic resin layer and intermediate layer, and dried to form a transparent photosensitive resin layer (4 μm in thickness).

TABLE 4

| | P1 |
|---|---|
| Benzyl methacrylate/methacrylic acid copolymer (mole ratio = 73/27, molecular weight = 30000) | 7.8 |
| Dipentaerythritol hexaacrylate | 5.2 |
| Fluorine type surfactant (Megafac F176, made by Dainippon Ink & Chemicals. Inc.) | 0.06 |
| Irgacure 651 (made by Chiba-Geigy) | 0.32 |
| Phenothiazine | 0.012 |
| Propylene glycol monomethyl ether acetate | 27 |
| Methyl ethyl ketone | 35 |

Furthermore, a cover film made of polypropylene (12 μm in thickness) was stuck on the above-mentioned photosensitive resin layer under pressure to form a transparent (P1) photosensitive transferring material.

These photosensitive transferring materials were used to produce a spacer and a projection for orientation control on a color filter in the following way. ITO was sputtered onto a color filter formed in advance (substrate: glass (0.7 mm in thickness)) to have a resistance of 20 Ω/□. The cover film of the A1 transparent photosensitive transferring material was peeled, and then a laminator (trade name: VP-11, made by Taisei Laminator Co., Ltd.) was used to stick the transferring material onto the color filter by heating (130° C.) under pressure (0.8 kg/cm²) in such a manner that the photosensitive resin layer contacted the ITO surface. Subsequently, peeling was performed between the intermediate layer and the photosensitive layer to transfer only the A1 transparent layer onto the glass substrate. Furthermore, the cover film of the P1 transparent photosensitive transferring material was peeled, and then the same sticking as described above was performed in such a manner that the P1 transparent layer surface contacted the A1 transparent layer surface. Peeling was then performed between the pre-support and the thermoplastic resin layer to transfer the A1 transparent photosensitive resin layer, the P1 transparent photosensitive resin layer, the intermediate layer and the thermoplastic resin layer onto the glass substrate.

Next, the resultant was exposed to light through a given chromium photo mask (2-gradation mask: first area optical density/second area optical density=1/0.1), and then the thermoplastic resin layer and the intermediate layer were removed with a developing solution (trade name: PD2, made by Fuji Photo Film Co., Ltd.). At this time, the photosensitive resin layers were not substantially developed. Next, the photosensitive resin layers were developed with a developing solution (trade name: CD1, made by Fuji Photo Film Co., Ltd.) to remove unnecessary portions. Finishing treatment (brush treatment) was then conducted with a developing solution (trade name: SD1, made by Fuji Photo Film Co., Ltd.) to form a pattern made of only the A1 layer and a transparent pixel pattern made of the laminated A1 and P1 layers. Next, the resultant was baked at 240° C. for 50 minutes to form a spacer pattern (3.7 μm in height) and a projection for orientation control (1.0 μm in thickness) on the ITO.

Example 4

Formation of a Spacer and a Projection for Orientation Control

A transparent pixel pattern of Example 4 was formed in the same way as in Example 3 except that instead of the formation of the A1 transparent photosensitive resin layer in Example 3, a photosensitive solution of transparent color (for an A1 layer), having a formulation shown in Table 3, was directly applied onto a polyethylene terephthalate film pre-support (75 μm in thickness), and dried to form an A1 transparent photosensitive resin layer (1.2 μm in film thickness). Next, the resultant was baked at 240° C. for 50 minutes to form a spacer pattern (3.7 μm in height) and a projection for orientation control (1.0 μm in thickness) on the ITO.

According to the invention, it is possible to provide a method for forming a color filter easily, which is used suitably for an LCD for reflection and transmission displays wherein the optical density of areas corresponding to a reflection portion and the optical density of areas corresponding to a transmission portion are varied in each pixel; and a method for forming a spacer and a projection for orientation control simultaneously.

What is claimed is:
1. An image forming method comprising the steps of:
    (A) forming a first negative photosensitive resin layer on a substrate;
    (B) forming a second negative photosensitive resin layer on the first negative photosensitive resin layer;
    (C) exposing the substrate through a photo mask; and
    (D) developing the first and second negative photosensitive resin layers after exposure,
    wherein the steps A through D are performed at least twice, and
    wherein, in the step C, the photo mask is a photo mask comprising at least two light transmittable patterns, and the photosensitivity ratio of the first negative photosensitive resin layer to the second negative photosensitive resin layer is more than 1.
2. An image forming method according to claim 1, wherein in the steps A and B, a transfer sheet comprising at least a negative photosensitive resin layer on a transparent support is used.
3. An image forming method according to claim 2, wherein a coloring agent is added to the first and second negative photosensitive resin layers.
4. An image forming method according to claim 1, wherein in the steps A and B, a transfer sheet comprising, on a transparent support, at least a thermoplastic resin layer, an intermediate layer, and a negative photosensitive resin layer is used.
5. An image forming method according to claim 4, wherein a coloring agent is added to the first and second negative photosensitive resin layers.
6. An image forming method according to claim 1, wherein in the step A, a transfer sheet comprising on a transparent support at least a negative photosensitive resin layer is used, and in the step B, a transfer sheet comprising, on a transparent support, at least a thermoplastic resin layer, an intermediate layer, and a photosensitive resin layer is used.
7. An image forming method according to claim 6, wherein a coloring agent is added to the first and second negative photosensitive resin layers.

8. An image forming method according to claim 1, wherein a coloring agent is added to the first and second negative photosensitive resin layers.

9. A color filter for a liquid crystal display device, which is formed by an image forming method comprising the steps of:
- (A) forming a first negative photosensitive resin layer on a substrate;
- (B) forming a second negative photosensitive resin layer on the first negative photosensitive resin layer;
- (C) exposing the substrate through a photo mask; and
- (D) developing the first and second negative photosensitive resin layers after exposure, wherein the steps A through D are performed at least twice, and wherein, in the step C, the photo mask is a photo mask comprising at least two light transmittable patterns; the photosensitivity ratio of the first negative photosensitive resin layer to the second negative photosensitive resin layer is more than 1; and wherein a coloring agent is added to the first and second negative photosensitive resin layers.

10. A spacer for a liquid crystal display device, which is formed by an image forming method comprising the steps of:
- (A) forming a first negative photosensitive resin layer on a substrate;
- (B) forming a second negative photosensitive resin layer on the first negative photosensitive resin layer;
- (C) exposing the substrate through a photo mask; and
- (D) developing the first and second negative photosensitive resin layers after exposure, wherein, in the step C, the photo mask is a photo mask comprising at least two light transmittable patterns; the photosensitivity ratio of the first negative photosensitive resin layer to the second negative photosensitive resin layer is more than 1; and wherein a coloring agent is added to the first and second negative photosensitive resin layers.

11. A spacer for a liquid crystal display device according to claim 10, wherein the steps A through D are performed at least twice.

12. A projection for orientation control, which is formed by an image forming method comprising the steps of:
- (A) forming a first negative photosensitive resin layer on a substrate;
- (B) forming a second negative photosensitive resin layer on the first negative photosensitive resin layer;
- (C) exposing the substrate through a photo mask; and
- (D) developing the first and second negative photosensitive resin layers after exposure, wherein the steps A through D are performed at least twice, and wherein, in the step C, the photo mask is a photo mask comprising at least two light transmittable patterns; the photosensitivity ratio of the first negative photosensitive resin layer to the second negative photosensitive resin layer is more than 1; and wherein a coloring agent is added to the first and second negative photosensitive resin layers.

* * * * *